United States Patent
Kammler et al.

(10) Patent No.: US 8,481,404 B2
(45) Date of Patent: Jul. 9, 2013

(54) LEAKAGE CONTROL IN FIELD EFFECT TRANSISTORS BASED ON AN IMPLANTATION SPECIES INTRODUCED LOCALLY AT THE STI EDGE

(75) Inventors: Thorsten Kammler, Ottendorf-Okrilla (DE); Maciej Wiatr, Dresden (DE); Roman Boschke, Dresden (DE); Peter Javorka, Radeburg (DE)

(73) Assignee: GLOBALFOUNDRIES Inc., Grand Cayman (KY)

( * ) Notice: Subject to any disclaimer, the term of this patent is extended or adjusted under 35 U.S.C. 154(b) by 247 days.

(21) Appl. No.: 12/838,810

(22) Filed: Jul. 19, 2010

(65) Prior Publication Data

US 2011/0024846 A1    Feb. 3, 2011

(30) Foreign Application Priority Data

Jul. 31, 2009   (DE) .................. 10 2009 035 409

(51) Int. Cl.
*H01L 21/76*   (2006.01)
(52) U.S. Cl.
USPC ................................. 438/433; 257/E21.551
(58) Field of Classification Search
USPC ............... 438/307, 433, 221, 296, 404, 233, 438/424, 524, 528, 618; 257/E21.546, E21.551
See application file for complete search history.

(56) References Cited

U.S. PATENT DOCUMENTS

| | | | |
|---|---|---|---|
| 5,904,531 A | | 5/1999 | Liaw |
| 5,930,633 A | * | 7/1999 | Liaw ............................ 438/296 |
| 5,960,276 A | * | 9/1999 | Liaw et al. ..................... 438/224 |
| 6,710,413 B2 | * | 3/2004 | Thei et al. ..................... 257/382 |
| 7,968,424 B2 | * | 6/2011 | Lin et al. ........................ 438/433 |
| 2003/0006433 A1 | | 1/2003 | Funayama et al. |
| 2004/0102017 A1 | * | 5/2004 | Chang et al. ................... 438/424 |
| 2004/0178430 A1 | | 9/2004 | Rhodes et al. |
| 2006/0063338 A1 | * | 3/2006 | Menon et al. .................. 438/296 |
| 2006/0202744 A1 | * | 9/2006 | Utsuno ........................... 327/538 |
| 2006/0240636 A1 | | 10/2006 | Ryu et al. ....................... 438/424 |
| 2007/0023832 A1 | | 2/2007 | Matsui |
| 2008/0029825 A1 | | 2/2008 | Saito et al. ..................... 257/371 |
| 2008/0153221 A1 | * | 6/2008 | Sridhar et al. ................. 438/230 |
| 2008/0203493 A1 | | 8/2008 | Yasuda .......................... 257/377 |

(Continued)

FOREIGN PATENT DOCUMENTS

DE    102005063131 A1    7/2007

OTHER PUBLICATIONS

Translation of Official Communication from German Patent Office for German Patent Application No. 10 2009 035 409.3 dated Apr. 23, 2010.
International Search Report from PCT/IB2010/053437 dated Nov. 10, 2010.

(Continued)

*Primary Examiner* — Matthew Landau
*Assistant Examiner* — Joseph C Nicely
(74) *Attorney, Agent, or Firm* — Williams, Morgan & Amerson, P.C.

(57) ABSTRACT

In a static memory cell, the failure rate upon forming contact elements connecting an active region with a gate electrode structure formed above an isolation region may be significantly reduced by incorporating an implantation species at a tip portion of the active region through a sidewall of the isolation trench prior to filling the same with an insulating material. The implantation species may represent a P-type dopant species and/or an inert species for significantly modifying the material characteristics at the tip portion of the active region.

20 Claims, 12 Drawing Sheets

U.S. PATENT DOCUMENTS

| | | | |
|---|---|---|---|
| 2009/0206429 A1* | 8/2009 | Rhodes et al. | 257/431 |
| 2009/0236667 A1* | 9/2009 | Schwan et al. | 257/374 |
| 2009/0278181 A1* | 11/2009 | Tanaka et al. | 257/292 |
| 2012/0164803 A1* | 6/2012 | Chen et al. | 438/230 |

OTHER PUBLICATIONS

International Preliminary Report on Patentability and Written Opinion from PCT/IB2010/053437 dated Feb. 9, 2012.

* cited by examiner

LEAKAGE CONTROL IN FIELD EFFECT TRANSISTORS BASED ON AN IMPLANTATION SPECIES INTRODUCED LOCALLY AT THE STI EDGE

BACKGROUND OF THE INVENTION

1. Field of the Invention

Generally, the present disclosure relates to integrated circuits, and, more particularly, to the manufacture of field effect transistors in complex circuits including memory areas, for instance, in the form of a cache memory of a CPU.

2. Description of the Related Art

Integrated circuits comprise a large number of circuit elements on a given chip area according to a specified circuit layout, wherein transistor elements represent one of the dominant semiconductor elements in the integrated circuits. Hence, the characteristics of the individual transistors significantly affect overall performance of the complete integrated circuit. Generally, a plurality of process technologies are currently practiced, wherein, for complex circuitry, such as microprocessors, storage chips, ASICs (application specific ICs) and the like, CMOS technology is currently one of the most promising approaches due to the superior characteristics in view of operating speed and/or power consumption and/or cost efficiency. During the fabrication of complex integrated circuits using CMOS technology, millions of complementary transistors, i.e., N-channel transistors and P-channel transistors, are formed on a substrate including a crystalline semiconductor layer. A MOS transistor, irrespective of whether an N-channel transistor or a P-channel transistor is considered, comprises so-called PN junctions that are formed by an interface of highly doped drain and source regions with an inversely or weakly doped channel region disposed between the drain region and the source region. The conductivity of the channel region, i.e., the drive current capability of the conductive channel, is controlled by a gate electrode formed above the channel region and separated therefrom by a thin insulating layer. The conductivity of the channel region, upon formation of a conductive channel due to the application of an appropriate control voltage to the gate electrode, depends on the dopant concentration, the mobility of the majority charge carriers and, for a given extension of the channel region in the transistor width direction, on the distance between the source and drain regions, which is also referred to as channel length.

On the other hand, the drive current capability of MOS transistors also depends on the transistor width, i.e., the extension of the transistor in a direction perpendicular to the current flow direction, so that the gate length, and thus the channel length, in combination with the transistor width, are dominant geometric parameters, which substantially determine the overall transistor characteristics, in combination with "transistor internal" parameters, such as overall charge carrier mobility, threshold voltage, i.e., a voltage at which a conductive channel forms below the gate insulation layer upon applying a control signal to the gate electrode, and the like. On the basis of field effect transistors, such as N-channel transistors and P-channel transistors, more complex circuit components are designed, depending on the overall circuit layout. For instance, storage elements in the form of registers and static RAM (random access memory) cells, represent important components of complex logic circuitries. For example, during the operation of complex CPU cores, a large amount of data has to be temporarily stored and retrieved, wherein the operating speed and the capacity of the storage elements have a significant influence on the overall performance of the CPU. Depending on the memory hierarchy used in a complex integrated circuit, different types of memory elements are used. For instance, registers and static RAM cells are typically used in the CPU core due to their superior access time, while dynamic RAM elements are preferably used as working memory due to the increased bit density compared to registers or static RAM cells. Typically, a dynamic RAM cell comprises a storage capacitor and a single transistor, wherein, however, a complex memory management system is required to periodically refresh the charge stored in the storage capacitors, which may otherwise be lost due to unavoidable leakage currents. Although the bit density of dynamic RAM devices may be very high, charge has to be transferred from and to the storage capacitors in combination with periodic refresh pulses, thereby rendering these devices less efficient in terms of speed and power consumption compared to static RAM cells. Thus, static RAM cells may be advantageously used as high speed memory with moderately high power consumption, while, however, requiring a plurality of transistor elements so as to allow the reliable storage of an information bit.

Consequently, a further increase in bit density of static memory areas requires the employment of field effect transistors of reduced dimensions and appropriate transistor performance with respect to operation speed, drive current capability and the like. For this purpose, frequently, the densely packed memory areas of semiconductor devices are provided as a bulk configuration, i.e., the active regions of the transistor devices are vertically restricted by well regions instead of a buried insulating layer, as is the case in silicon-on-insulator (SOI) configurations, while the lateral delineation of the active regions is accomplished on the basis of trench isolations. Although, in principle, SOI transistors may provide advantages in performance with respect to operating speed due to a reduced junction capacitance, which may be appropriate for transistors in speed critical signal paths, the transistors in static memory areas may have to be operated on the basis of stable threshold voltage conditions, which may not be efficiently met on the basis of an SOI configuration, unless the overall transistor dimensions are appropriately increased to take into consideration any threshold variations as may be caused by the so-called floating body effect. Since "bulk" transistors may provide superior inherent threshold stability, while the switching speed may be less critical compared to speed critical signal paths in logic portions of complex semiconductor devices, an increased transistor density and thus bit density may be accomplished on the basis of the bulk configuration.

In addition to reduced transistor dimensions for obtaining a high bit density, the wiring network in these densely packed device regions also has to be appropriately adapted to the reduced dimensions. Typically, most of the electrical interconnections between the individual semiconductor elements, such as the transistor elements, are provided on the basis of a stack of metallization layers, thereby requiring a complex metallization system, which may finally be connected to the individual circuit elements by using a contact structure, which may be understood as an interface between the actual semiconductor elements, such as transistors, capacitors and the like, and the complex wiring system. A corresponding contact structure comprises a plurality of contact elements formed in an interlayer dielectric material, which encloses and passivates the semiconductor elements. These contact elements are formed of any appropriate conductive material, such as tungsten, aluminum and the like, possibly in combination with an appropriate barrier material, and connect to specific contact areas of the circuit elements, such as gate electrode structures, drain and source regions of the transistors and the like. Due to the reduced transistor dimensions, in particular in densely packed static memory areas, the contact elements are to be adapted in size and position to the configuration of the densely packed transistors, while at the same time a space-efficient interconnection of the individual circuit elements is to be achieved. For this purpose, some contact elements may be appropriately configured in order to "directly" connect different circuit elements without requiring an additional connection to one or more of the above-lying metallization layers.

With reference to FIGS. 1a-1d, a typical design of a static memory cell in advanced semiconductor devices and corresponding manufacturing techniques will be described in more detail, thereby illustrating specific problems associated with complex contact structures, which may finally lead to significant yield losses.

FIG. 1a schematically illustrates a circuit diagram of a static RAM cell 150, as may typically be used in modern integrated circuits. The memory cell 150 comprises a storage element 151 which may include two inversely coupled inverters 152A, 152B, each of which includes a complementary transistor pair formed by a P-channel transistor 100P and an N-channel transistor 100N. The transistors 100P may also be referred to as "pull up" transistors, while the transistors 100N may be referred to as "pull down" transistors. Furthermore, the memory cell 150 comprises pass transistors 100A, which may connect the memory cell 151 to a bit line, indicated as BL, and an inverse bit line, indicated as $\overline{BL}$, respectively. Thus, the gate electrodes of the pass transistors 100A may be considered as a word line, which may thus be enabled in order to perform read and write operations on the memory cell 151. As is evident from FIG. 1a, in addition to the six transistors 100P, 100N, 100A, a plurality of interconnections between these transistor elements is also required in order to realize the circuit design as illustrated in FIG. 1a.

FIG. 1b schematically illustrates a top view of an actual semiconductor device or a layout thereof in which the memory cell 150, i.e., the six transistors, and a portion of the associated electrical connections is implemented. As illustrated, a plurality of active regions 102A, 102B, 102C and 102D are laterally delineated by an isolation structure 103, which is typically provided in the form of a shallow trench isolation comprised of any appropriate insulating material, such as silicon dioxide and the like. On the other hand, the active regions 102A, 102B, 102C, 102D are to be understood as silicon-based semiconductor areas in which appropriate dopant profiles are formed to obtain PN junctions in accordance with the required transistor characteristics. For example, the active region 102A may accommodate one of the pass transistors 100A and one of the pull down transistors 100N, which both represent N-channel transistors. Similarly, the active region 102D may accommodate the other pass transistor 100A and the other pull down transistor 100N. On the other hand, the active regions 102B, 102C may represent active regions for the P-channel transistors 100P, wherein the transistor characteristics, such as the width of the active regions 102A, 102B, 102C, 102D, are appropriately selected in order to obtain the desired circuit behavior. That is, typically, the pull down transistors 100N are provided as transistors having an increased transistor width in order to provide an enhanced switching time and drive current capability, for instance compared to the pass transistors 100A. Furthermore, the pull up transistors 100P have a reduced drive current compared to the transistors 100N due to the fact that the transistors 100P represent P-channel transistors and the width of the active regions 102B, 102C is less compared to the active regions 102A, 102D. Moreover, gate electrode structures 110 are formed above the active regions 102A, 102B, 102C, 102D and partially above the isolation structure 103 in accordance with transistor requirements. In order to reduce the number of additional metal lines in a metallization system, a respective one of the pull down transistors 100N shares a gate electrode structure 110 with a corresponding pull up transistor 100P, thereby providing electrical connections as required by the circuit diagram of FIG. 1a. Furthermore, a plurality of contact elements 121A, 121B are provided in order to contact the transistors 100N, 100P, 100A, i.e., the active regions 102A, 102B, 102C, 102D and/or corresponding gate electrode structures 110. For instance, "regular" contact elements 121A are provided to connect to the active regions of the transistors, i.e., to drain and/or source regions of these transistors, while the contact elements 121B have a specific design so as to connect an active region of one of the pull up transistors 100P with the gate electrode structure 110 of the other pull up transistor 100P and the associated pull down transistor 100N. Consequently, the contact elements 121B may be formed above the isolation structure 103 and a corresponding active region which, however, may result in increased yield losses, in particular when sophisticated transistor architectures are considered, as will be described in more detail with reference to FIGS. 1c and 1d.

FIG. 1c schematically illustrates a cross-sectional view along the line Ic of FIG. 1b. As illustrated, a semiconductor device 100 comprising the memory cell 150 (FIG. 1b) comprises a substrate 101, such as a silicon substrate, an upper portion of which may represent a crystalline silicon-based semiconductor material 102. The isolation structure 103 laterally delineates the active region 102C within the semiconductor material 102, while a vertical extension of the active region 102C is defined by a well dopant species, such as an N-type dopant species, as the pull up transistor 100P represents a P-channel transistor, as previously discussed. In the manufacturing stage shown, the transistor 100P comprises drain and source regions 104, i.e., strongly P-doped regions which form, with the remaining portion of the active region 102C, respective PN junctions. Furthermore, a channel region 107 is located between the drain and source regions 104. Furthermore, the gate electrode structure 110 is formed above the active region 102C, wherein a gate electrode material 111 is separated from the channel region 107 by a gate dielectric material 112. It should be appreciated that the gate electrode material 111 and the gate dielectric material 112 may be provided in the form of any desired material or material composition, depending on the overall device requirements. For example, the gate dielectric material 112 may comprise a high-k dielectric material, i.e., a dielectric material having a dielectric constant of approximately 10.0 and higher, and the gate electrode material 111 may comprise a metal-containing material. In other cases, the gate electrode structure 110 has a more conventional configuration, i.e., the gate dielectric material 112 may be comprised of silicon dioxide, silicon nitride and the like, in combination with a polysilicon material and the like. Furthermore, a spacer structure 113 is formed on sidewalls of the gate electrode material 111 and is comprised of any appropriate material, such as silicon nitride, possibly in combination with etch stop materials in the form of silicon dioxide and the like. Furthermore, in this manufacturing stage, metal silicide regions 106 may be formed, at least in the drain and source regions 104, in order to reduce the overall series resistance of the transistor 100P and to provide low contact resistivity for any contact elements to be formed in a later manufacturing stage. As illustrated, the metal silicide 106 may also be formed in the gate electrode structure 110. It should be appreciated that a gate electrode structure 110 is also formed above the isolation structure 103 (see FIG. 1b) which extends into the active regions 102B and 102A, as previously explained.

In some examples, the transistor 100P may be formed on the basis of critical dimensions of approximately 50 nm and less, i.e., a length of the gate electrode material 111 may be 50 nm and less, thereby providing a high packing density in the memory cell 150 (see FIG. 1b). Moreover, frequently, the overall transistor performance may be enhanced by inducing a certain type of strain component in the channel region 107, which may be efficiently accomplished in P-channel transistors by incorporating a silicon/germanium alloy 105 in the drain and source regions 104. That is, due to the lattice mismatch between a silicon/germanium lattice and a silicon lattice, the material 105 has a strained state, which in turn induces a compressive strain component in the channel region 107, thereby increasing the charge carrier mobility, which in turn directly translates into an increased drive current capability and a higher switching speed.

Furthermore, the gate electrode structures 110 are embedded in an interlayer dielectric material 120, which may comprise an etch stop layer 122, such as a silicon nitride material and the like, in combination with a silicon dioxide material 123 and the like. It should be appreciated that a portion of the interlayer dielectric material 120 may also be used as a strain-inducing source, for instance, by providing the layer 122 in the form of a highly stressed dielectric material.

The semiconductor device 100 may be formed on the basis of any appropriate manufacturing regime, which may include sophisticated lithography and etch techniques for forming an isolation trench, which may subsequently be filled with an insulating material, thereby obtaining the isolation structure 103. Thereafter, the basic dopant concentration for the active region 102C and for any other active regions may be defined by ion implantation in combination with appropriately formed implantation masks. Next, the gate electrode structures 110 are formed by advanced lithography and etch techniques, followed by an appropriate process sequence for incorporating the silicon/germanium alloy 105 on the basis of selective epitaxial growth techniques. Thereafter, the drain and source regions 104 are formed in combination with the sidewall spacer structure 113, followed by a silicidation sequence for forming the regions 106. Thereafter, the interlayer dielectric material 120 may be deposited on the basis of any appropriate deposition technique, wherein well-established processes may be applied in order to obtain the desired configuration, for instance with respect to internal stress levels of the dielectric materials in the layer 120.

It should be appreciated that, due to the overall reduced device dimensions and the complex manufacturing sequence, tightly set process tolerances may have to be met in order to obtain the required device characteristics. For example, the process sequence for incorporating the silicon/germanium alloy 105 into the P-channel transistor 100P may require additional processes, which may result in a significant difference in topography between the isolation structure 103 and the active region 102C. Also, the silicidation process may result in a certain degree of non-uniformities of the metal silicide regions 106, in particular when nickel silicide is to be formed, which is typically used in view of superior conductivity compared to other metal silicide materials. Consequently, the further processing, i.e., the formation of contact elements in the interlayer dielectric material 120 so as to connect to the drain and source regions 104 and to the gate electrode 110 formed above the isolation structure 103, may have to be performed under very sophisticated conditions. Under these circumstances, in particular at the interface 103S, which delineates the active region 102C with respect to a length direction L of the active region 102C, contact failures may occur with increased probability upon forming the contact element 121B (see FIG. 1b) connecting the active region 102C, i.e., one of the regions 104, with the gate electrode 110 formed above the isolation structure 103.

FIG. 1d schematically illustrates the semiconductor device 100 with an etch mask 125 formed above the interlayer dielectric material 120 in order to define the lateral size and position of contact openings 120A, 120B, which are formed on the basis of an etch process 126, which is performed on the basis of an appropriate plasma assisted etch chemistry so as to etch through the material 123 and using the material 122 as an etch stop layer. Thereafter, the etch chemistry is appropriately selected so as to etch through the material 122, while using the metal silicide regions 106 as an etch stop. Moreover, in the contact opening 120B, the isolation structure 103 may also be partially exposed to the etch ambient and may result in undue material removal, in particular at the interface 103S, depending on the previously created surface topography and device characteristics, for instance with respect to the metal silicide 106 and the like. Furthermore, the spacer structure 113 above the isolation structure 103 may be eroded in a more or less pronounced degree, thereby also contributing to a further exposure of the region 103, which may result in undue material consumption during the etch process 126. Consequently, an additional cavity 120C may be formed in the isolation structure 103 and/or at an etch area of the active region 102C, wherein a depth of the cavity 120C may strongly depend on the previously created device configuration. In many cases, the cavity 120C may extend beyond the drain or source region 104, which may finally result in the creation of an additional leakage path after filling the contact openings 120B, 120A with a conductive material. In some cases, a total failure of the transistor 100P may be observed due to the short circuit between the drain and source region 104 and the remaining N-doped well region 102C due to the cavity 120C filled with the contact material. Consequently, upon further increasing the overall device density in static memory cells, even further sophisticated conditions may be created during the complex contact etch step, thereby resulting in additional yield losses, thereby rendering the conventional process strategy less attractive for further device scaling.

The present disclosure is directed to various methods and devices that may avoid, or at least reduce, the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure relates to methods and semiconductor devices in which contact failures in densely packed memory cells may be reduced by increasing the "error tolerance" when forming contact openings in a contact level of the memory cell. As previously explained, it has been recognized that, in particular, an interface between an isolation structure and an active region of a pull up transistor of a memory cell may represent a failure prone area when forming a contact element that directly connects the active region, i.e., the drain or source region of the pull up transistor, with a portion of the gate electrode structure formed above the isolation trench. That is, in particular, the "tip" of the active region of the pull up transistor with respect to a length direction has been recognized as a major source of contact failures. According to the principles disclosed herein, this device area may be specifically modified so as to impart an enhanced failure tolerance to this area during the contact etch process, which may be accomplished by incorporating an appropriate species into the active region through a sidewall of an isolation trench, substantially without affecting any other areas of the active region. To this end, according to one illustrative embodiment disclosed herein, a dopant species is incorporated so as to locally increase the depth of drain and source regions in the vicinity of the interface between the isolation structure and the active region. In other illustrative embodiments disclosed herein, a species may be incorporated so as to locally modify material characteristics of the active region, for instance, by significantly reducing the conductivity and/or increasing the etch resistivity during the contact etch process.

One illustrative method disclosed herein comprises forming an isolation trench in a semiconductor material of a semiconductor device, wherein the isolation trench has a sidewall connecting to an active region of a first transistor of a memory cell of the semiconductor device. The sidewall delineates the active region in a length direction. The method further comprises introducing an implantation species into a portion of the active region through at least a portion of the sidewall, wherein the implantation species extends along the length direction with a specified distance from the sidewall into the active region. Additionally, the isolation trench is filled with an insulating material after introducing the implantation species, thereby forming an isolation structure. The method further comprises forming the first transistor in and above the active region and forming a portion of a gate electrode of a second transistor of the memory cell above the isolation structure. Additionally, a dielectric material is provided so as to enclose the first transistor and the second transistor. Furthermore, a contact element is formed in the dielectric material, wherein the contact element connects the active region and the portion of the gate electrode of the second transistor.

A further illustrative method disclosed herein comprises forming an isolation trench in a semiconductor material and in an insulating material that is formed on the semiconductor material, wherein the isolation trench laterally delineates a first active region of one or more P-channel transistors and a second active region of one or more N-channel transistors and wherein the isolation trench has a sidewall connecting to a portion of the first active region. The method further comprises forming a mask so as to expose the first active region and at least the sidewall and to cover the second active region and a portion of the isolation trench. The method additionally comprises implanting a species into the first active region through the sidewall by performing an implantation process on the basis of a non-zero tilt angle and using the mask and the insulating material as an implantation mask. Additionally, the isolation trench is filled with an insulating material so as to form an isolation structure. Moreover, the one or more P-channel transistors are formed in and above the first active region and the one or more N-channel transistors are formed in and above the second active region. Additionally, the method comprises forming a contact element so as to connect the first active region with a gate electrode of at least one of the one or more N-channel transistors.

One illustrative semiconductor device disclosed herein comprises a first P-channel transistor formed in and above a first active region and a second P-channel transistor formed in and above a second active region, wherein the first and second P-channel transistors comprise drain and source regions having three different depth levels. The semiconductor device further comprises an N-channel transistor formed in and above a third active region and comprising drain and source regions with two different depth levels, wherein the second P-channel transistor and the N-channel transistor share a gate electrode structure that comprises an electrode portion formed above an isolation structure. Additionally, the semiconductor device comprises a contact element formed in an interlayer dielectric material covering the first and second P-channel transistors and the N-channel transistor, wherein the contact element connects the electrode portion with the first active region.

BRIEF DESCRIPTION OF THE DRAWINGS

The disclosure may be understood by reference to the following description taken in conjunction with the accompanying drawings, in which like reference numerals identify like elements, and in which:

FIG. 1a schematically illustrates a circuit diagram of a static RAM cell;

FIG. 1b schematically illustrates a typical layout or semiconductor device implementing the circuit diagram of FIG. 1a;

Figures 1A, 1B:
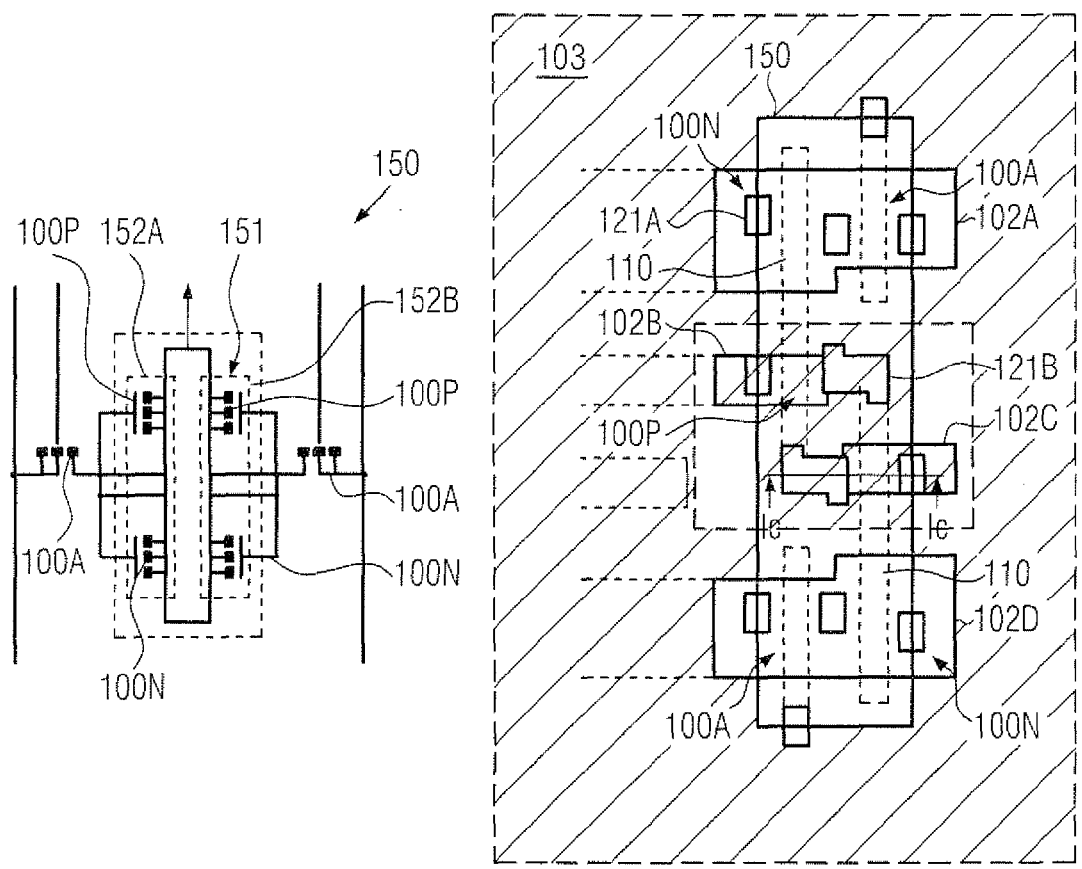
Figure 1C:
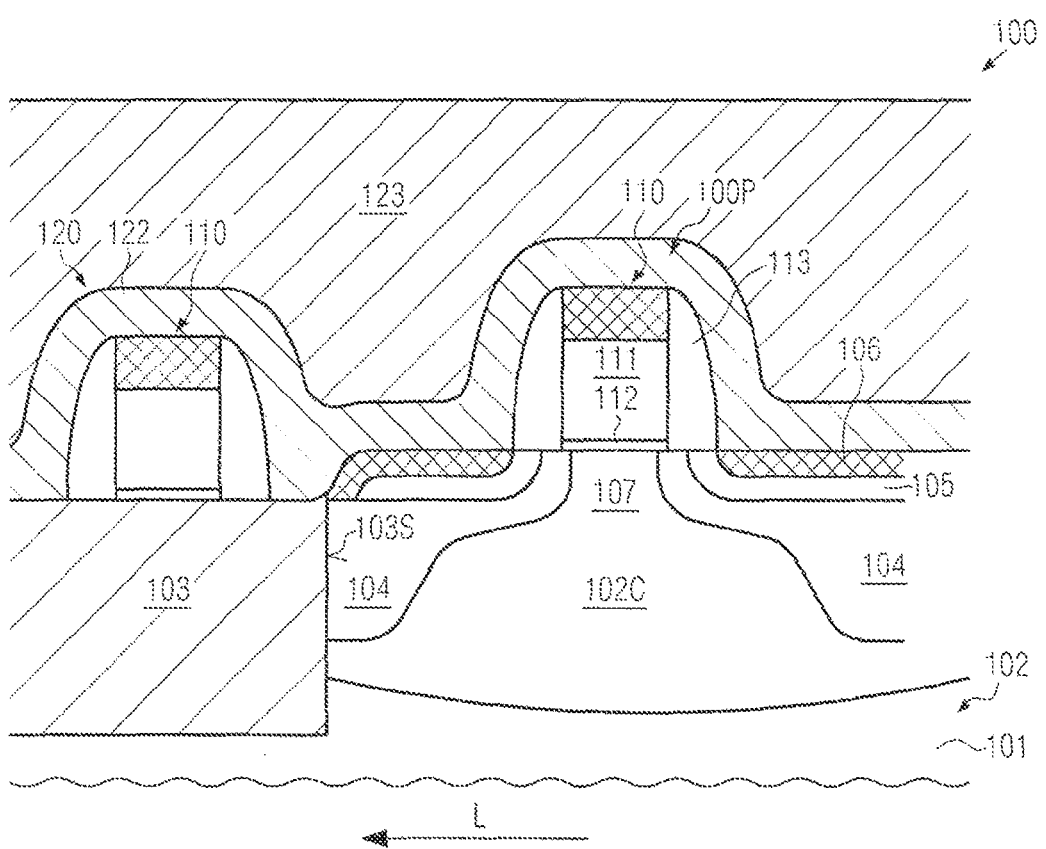
FIGS. 1c-1d schematically illustrate cross-sectional views of a portion of the memory cell during various manufacturing stages in forming sophisticated contact elements according to conventional strategies.
Figure 1D:
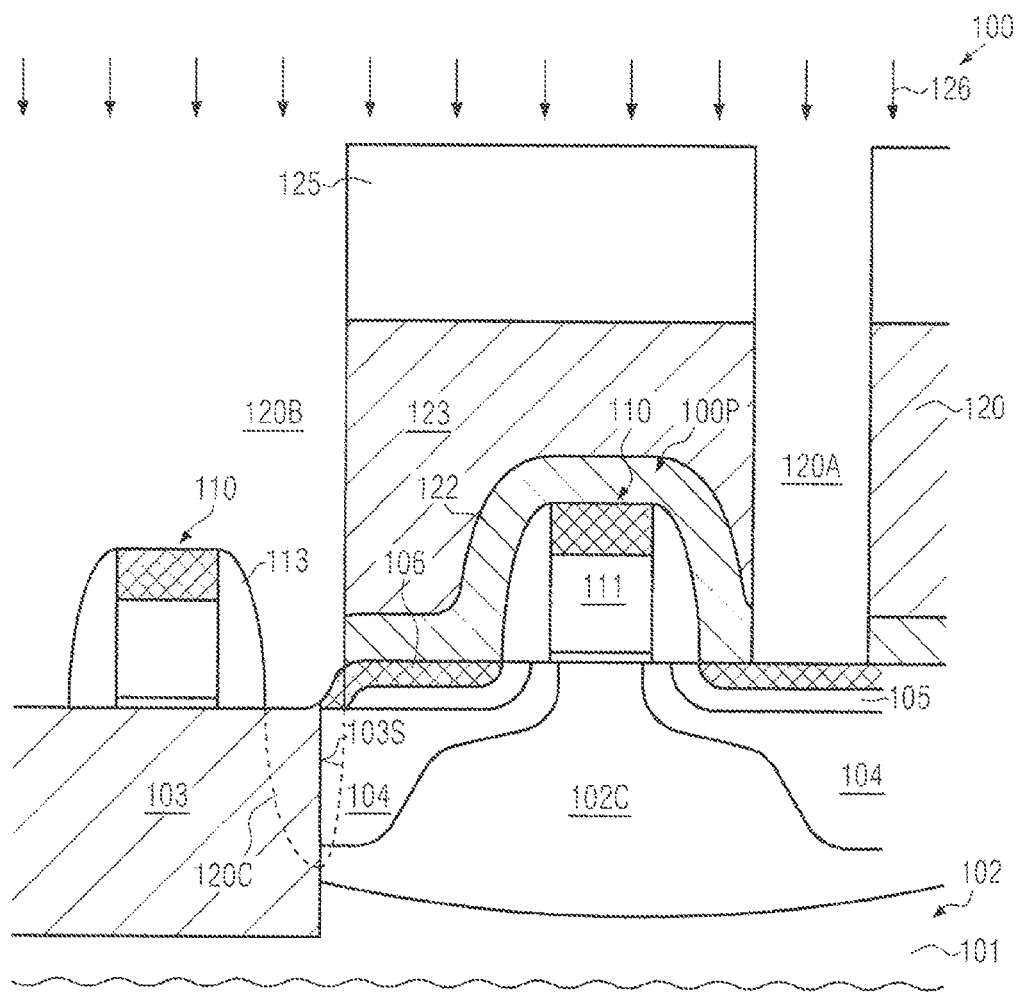

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

Generally, the present disclosure contemplates manufacturing techniques and semiconductor devices in which the error tolerance for forming contact elements that directly connect an active region of a pull up transistor with the gate electrode structure of another pull up transistor and a pull down transistor of a memory cell is increased by incorporating an appropriate implantation species in an early manufacturing stage. To this end, after etching the isolation trenches in the semiconductor material, an implantation species is selectively introduced into at least some of the active regions through a sidewall of the isolation trench that terminates the active region under consideration with respect to its length direction. Generally, a length direction of an active region is to be understood as the basic current flow direction of one or more transistors to be formed in and above the active region under consideration. Consequently, by locally modifying the material characteristics of the active region at a "tip portion" or at an interface that delineates the active region in the length direction, the overall transistor characteristics may be influenced to a negligible amount since the modified portion is positioned farthest away from the channel region of the corresponding transistors. In some illustrative embodiments, an efficient modification and thus increase of the failure tolerance during the complex contact etch process may be achieved by incorporating a dopant species providing the same type of conductivity as the drain and source dopants, thereby locally increasing a depth level of the drain and source regions at the interface, since the dopant species may be incorporated through the trench sidewall to any desired depth, which may be accomplished by applying an appropriate tilt angle during the implantation process. In other illustrative embodiments, in addition or alternatively to incorporating a dopant species corresponding to the conductivity type of the drain and source dopant species, other implantation species may be incorporated in order to locally increase the etch resistivity and/or reduce the conductivity of the active region. For example, introducing appropriate species, such as nitrogen, carbon, oxygen and the like, may locally modify the etch resistivity, thereby reducing the degree of material erosion during the complex contact etch process, even if a pronounced difference in height levels between the active region and the isolation structure will be created during the further processing of the semiconductor device. Consequently, since a further optimization of the complex contact etch process may be very difficult to be achieved, the present disclosure significantly relaxes the stringent requirements imposed on the etch process and thus enables further device scaling on the basis of available etch techniques. On the other hand, the overall transistor characteristics may be maintained, thereby not requiring any significant modifications of the overall transistor configuration.

With reference to FIGS. 2a-2m, further illustrative embodiments will now be described, wherein reference may also be made to FIGS. 1a-1d, if appropriate.

Figure 2A:
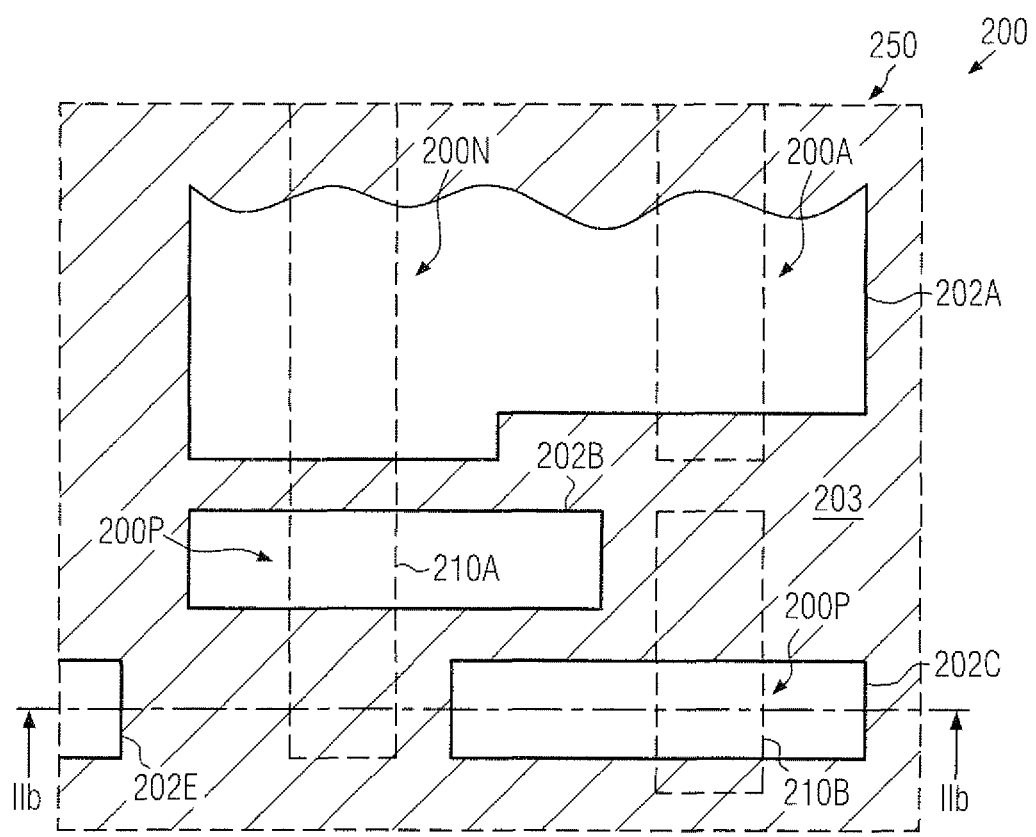
FIG. 2a schematically illustrates a top view or a layout of a portion of a memory cell having substantially the same configuration as illustrated in FIG. 1b.

FIG. 2a schematically illustrates a top view of a semiconductor device 200 or of a corresponding circuit layout thereof, wherein a portion of a memory cell 250 is illustrated. The illustrated portion of the memory cell 250 may comprise a plurality of active regions 202A, 202B, 202C which are laterally delineated by an isolation structure 203. It should be appreciated that the layout or the configuration of the memory cell 250 may substantially correspond to the configuration as shown in FIG. 1b, thereby implementing a circuit as illustrated in FIG. 1a. For instance, the active region 202A corresponds to the active region 102A and accommodates a pass transistor 200A and a pull down transistor 200N, which may be implemented in the form of N-channel transistors, as previously explained. Similarly, the active regions 202B, 202C may correspond to the active regions 102B, 102C, as previously explained with reference to FIG. 1b. It should be appreciated that the active regions 202A, 202B, 202C may be appropriately continued so as to form a neighboring memory cell of which, for convenience, only a portion of an active region 202E is illustrated. Furthermore, as is also previously discussed, the memory cell 250 may comprise gate electrode structures so as to constitute the respective transistors 200A, 200N, 200P and also provide an electrical connection between some of these transistors. For instance, a gate electrode structure 210A may be formed above the active regions 202A, 202B and above the isolation structure 203, while a gate electrode structure 210B may be formed above the active region 202C and the isolation structure 203. Consequently, upon forming a contact element connecting to the gate electrode structure 210A and to the active region 202C, an efficient contact regime may be obtained in accordance with the circuit diagram of FIG. 1a, as is also previously discussed.

With respect to any further aspects of the components described so far, the same criteria may apply as previously explained with reference to the memory cell 150 of FIGS. 1a and 1b.

Figure 2B:
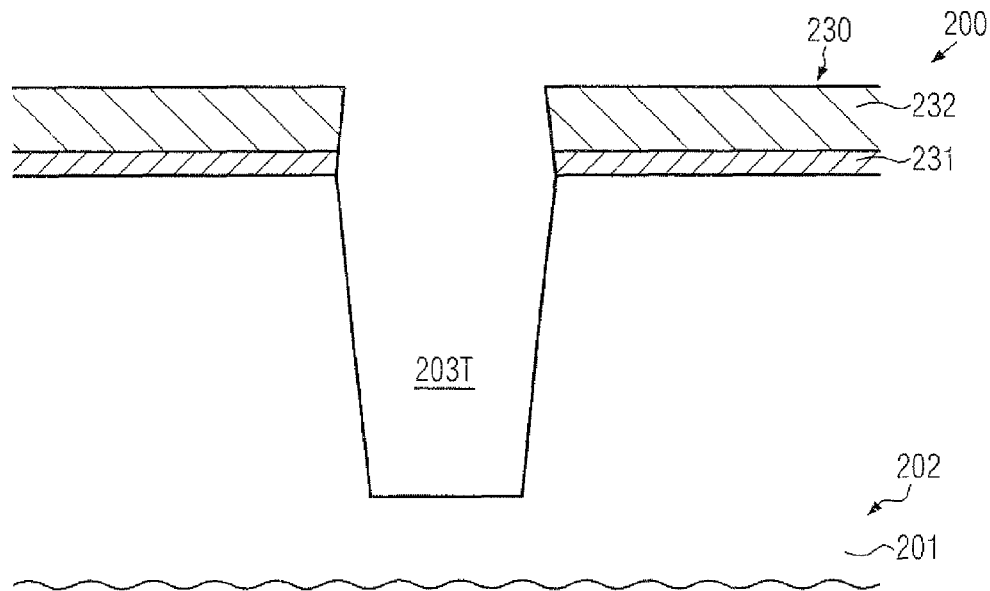
FIGS. 2b-2c schematically illustrate cross-sectional views of a portion of the memory cell during various manufacturing stages in forming an isolation trench and imparting superior material characteristics to a tip portion of an active region, according to illustrative embodiments.

FIG. 2b schematically illustrates a cross-sectional view of the semiconductor device 200 taken along the line IIb as shown in FIG. 2a. The device 200 is illustrated in an early manufacturing stage, i.e., an isolation trench 203T is formed in a semiconductor material 202, which may be formed above a substrate 201 or which may represent an upper portion of a crystalline substrate material. It should be appreciated that the material 202 may define a bulk configuration, as explained above, which is to be understood such that a depth of an active region formed or to be formed in the semiconductor material 202 is to be defined on the basis of a dopant species, rather than by a buried insulating material, which may, for instance, in some illustrative embodiments, be provided in other device areas in which an SOI architecture is considered advantageous. In the embodiment shown, the isolation trench 203T may have an appropriate depth so as to laterally insulate corresponding active regions. Furthermore, a mask may be provided in the form of a dielectric material 230, which frequently is provided in the form of a first layer 231, such as a silicon dioxide material, followed by a further dielectric material 232, such as a silicon nitride material. The materials 230 may be used as a hard mask material, possibly in combination with a resist mask, in order to form the trench 203T on the basis of well-established process techniques. That is, the materials 231 and 232 may be formed on the semiconductor material 202, for instance by oxidation and deposition, followed by sophisticated lithography techniques for providing an appropriate resist mask (not shown). Thereafter, the materials 230 may be patterned by using appropriate etch techniques, followed by a further process step for etching into the semiconductor material 202, thereby forming the isolation trench 203T, which may thus define the lateral position and size of the various active regions, as is for instance shown in FIG. 2a. Prior to or after forming the isolation trench 203T, the well dopant species may be introduced by implantation and the like, in combination with an appropriate masking regime.

Figure 2C:
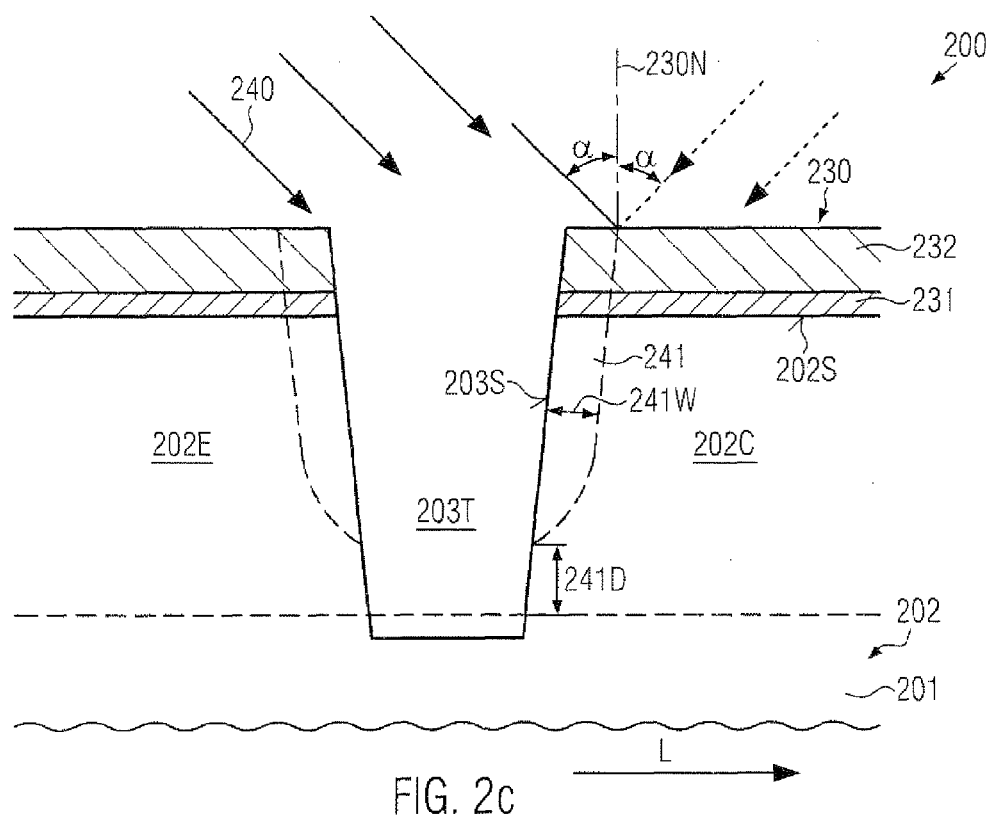

FIG. 2c schematically illustrates the semiconductor device 200 in a further advanced manufacturing stage. As illustrated, the active regions 202C, 202E, laterally separated by the isolation trench 203T, are indicated by a dashed line, irrespective of whether these regions are actually formed in this manufacturing stage or are to be formed in a later manufacturing stage after filling the isolation trench 203T with an appropriate insulating material. Thus, a sidewall 203S represents, in this manufacturing stage, a boundary of the active region 202C with respect to a length direction L, as also discussed before. Furthermore, the semiconductor device 200 may be subjected to an ion implantation process 240 during which an implantation species 241 may be introduced through a portion of the sidewall 203S into the active region 202C. For this purpose, the implantation process 240 may be performed by applying an appropriately selected tilt angle $\alpha$, which is to be understood as the angle of incidence of the parallel ion beam of the process 240 with respect to a surface normal 230N of the layer 230, as illustrated. Thus, the tilt angle $\alpha$ may be considered as a positive angle for incorporating the species 241 through the sidewall 230S, while a negative tilt angle $-\alpha$ may be applied to introduce a dopant species into the active region 202E, if desired. In one illustrative embodiment, the implantation species 241 may represent a P-type dopant species, such as boron and the like, thereby providing a moderately high P-type dopant concentration at and near the sidewall 203S, wherein, however, a depth level of the species 241 is restricted to be less than a depth level of the active region 202C, i.e., of the corresponding well dopant species formed or to be formed in the semiconductor material 202. For this purpose, the tilt angle $\alpha$ may be selected in accordance with the aspect ratio and the overall shape of the trench 203T so as to maintain the difference 241D in the depth level of the implantation region 241 and the active region 202C. That is, for an aspect ratio of roughly 1, the tilt angle $\alpha$ is to be selected to >45°, wherein a reduced trench width at the bottom of the trench 203T, as for instance illustrated in FIG. 2c, may result in an increased offset 241D for a given aspect ratio at the top of the trench 203T. Consequently, by appropriately selecting the tilt angle $\alpha$ so as to obtain the desired offset 241D, "shorting" the active region 202C and thus bridging the active regions 202C and 202E may be avoided. Furthermore, based on an appropriate implantation species, further implantation parameters, such as dose and, in particular, energy, may be selected such that an unwanted incorporation of the species 241 through a surface 202S of the active region 202C may be avoided. For this purpose, the energy during the implantation process 240 is adapted to the material composition and the thickness of the layers 230 such that these materials provide sufficient ion stop capabilities in order to suppress penetration of the active region 202C and of other active regions, such as the active region 202E. Appropriate implantation energies may be readily determined on the basis of experiments and/or simulation upon taking into consideration the desired tilt angle $\alpha$. That is, typically, the stopping capability may be inversely proportional to the cosine of the tilt angle $\alpha$. Based on the corresponding energy, a certain penetration distance or width 241W may be obtained, which may depend on the degree of channeling effect and the material composition of the active region 202C. In some cases, the implantation process 240 may comprise an additional implantation step for damaging or amorphizing a portion of the active region 202C, if a corresponding channeling behavior may be considered inappropriate. Furthermore, in some illustrative embodiments, as will be described later on in more detail, other implantation species may be incorporated in addition or alternatively to a P-type dopant so as to appropriately modify the characteristics of the material in the implantation region 241.

Figure 2D:
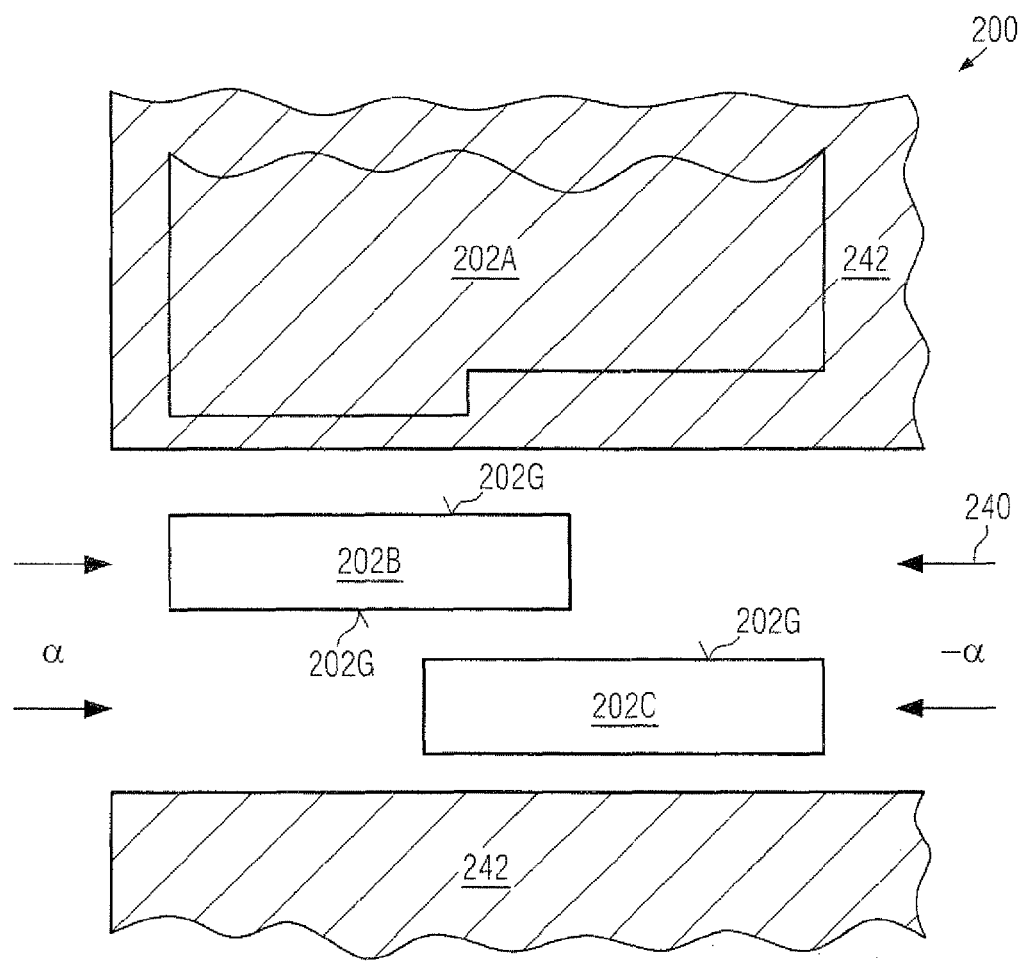
FIG. 2d schematically illustrates a top view of the semiconductor device during an implantation sequence for incorporating an implantation species on the basis of a non-zero tilt angle while covering other device areas, according to illustrative embodiments.

FIG. 2d schematically illustrates a top view of the device 200 according to further illustrative embodiments. As illustrated, an implantation mask 242 may be provided so as to cover areas in which an incorporation of the implantation species 241 (see FIG. 2c) may not be desirable. For example, the active region 202A for accommodating N-channel transistors, as previously explained, may be covered by the mask 242, while the active regions 202C, 202B of the pull up transistors may be exposed, since here the critical contacts have to be formed. Consequently, in some illustrative embodiments, the implantation process 240 performed on the basis of the tilt angle $\alpha$ may be adjusted such that a substantially parallel component of the beam 240 may be achieved. That is, an angle of incidence of the beam 240 with respect to the length direction may be approximately 0° or 180°, depending on the overall orientation, so as to substantially avoid penetration of implantation species through sidewalls 202G of the active regions 202B, 202C. It should be appreciated that advantageously the beam 240 is parallel to the length direction according to a difference in angle of incidence of less than 1° and preferably of less than 0.1°.

The implantation mask 242, for instance provided in the form of a resist mask, may be obtained on the basis of available lithography masks, which may frequently be used for specifically adjusting the characteristics of P-channel transistors in memory areas, while covering other transistors and other device areas. In other cases, specifically designed lithography masks may be used.

Figure 2E:
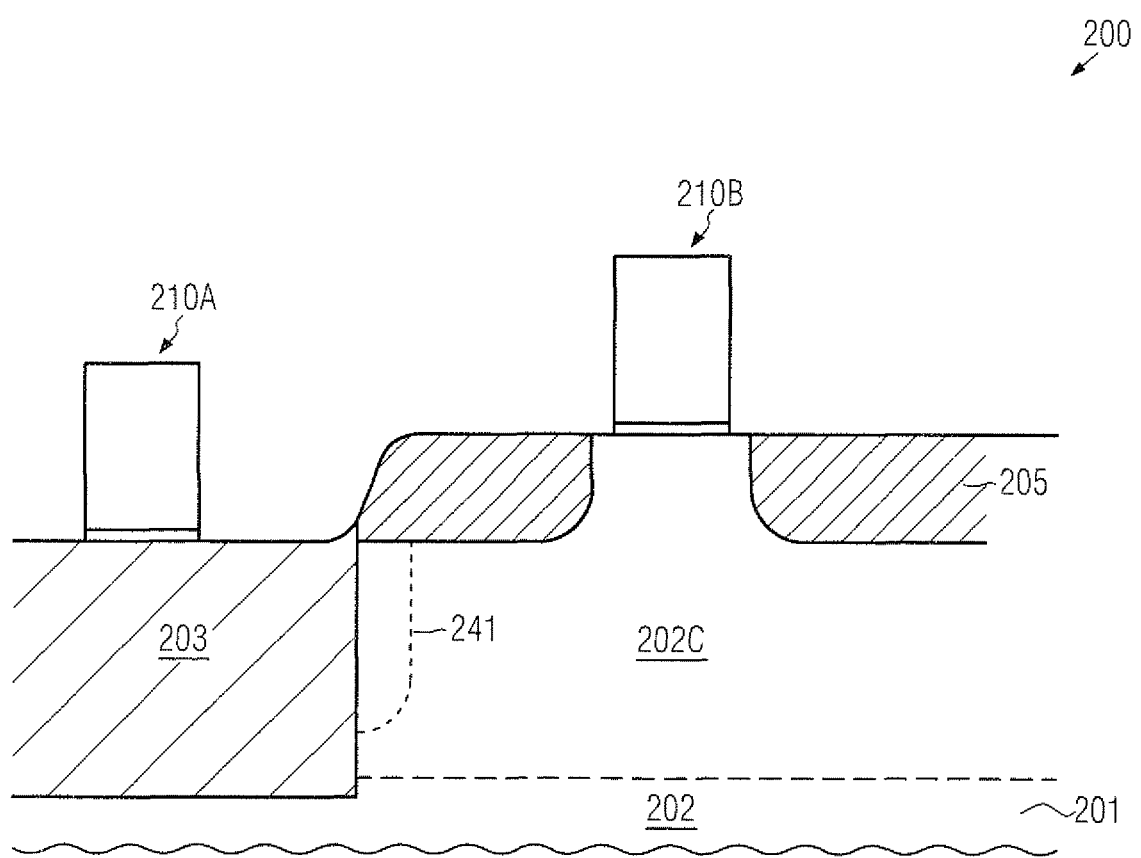
FIGS. 2e-2g schematically illustrate cross-sectional views of the semiconductor device during various manufacturing stages in forming transistors and contact elements, according to illustrative embodiments.

FIG. 2e schematically illustrates the semiconductor device 200 in a further advanced manufacturing stage. In this embodiment, the active region 202C may be provided as an N-doped region and may be delineated by the isolation structure 203. Furthermore, a strain-inducing semiconductor alloy 205, such as a silicon/germanium alloy, may be formed in the active region 202C. Additionally, the gate electrode structures 210B, 210A may be formed above the active region 202C and the isolation structure 203, respectively. Furthermore, a portion of the implantation region 241 is still provided at a portion of the interface between the isolation structure 203 and the active region 202C.

With reference to any process techniques for forming the semiconductor device 200 as illustrated in FIG. 2e, it may be referred to the corresponding manufacturing techniques described with reference to the device 100. That is, the isolation structure 203, the alloy 205, if required, and the gate electrode structures 210A, 210B may be formed in accordance with any appropriate process technique, after having incorporated the implantation species 241, as previously described. It should be appreciated that a portion of the active region 202C may be consumed during the formation of the isolation structure 203, for instance caused by an oxidation process and the like.

Figure 2F:
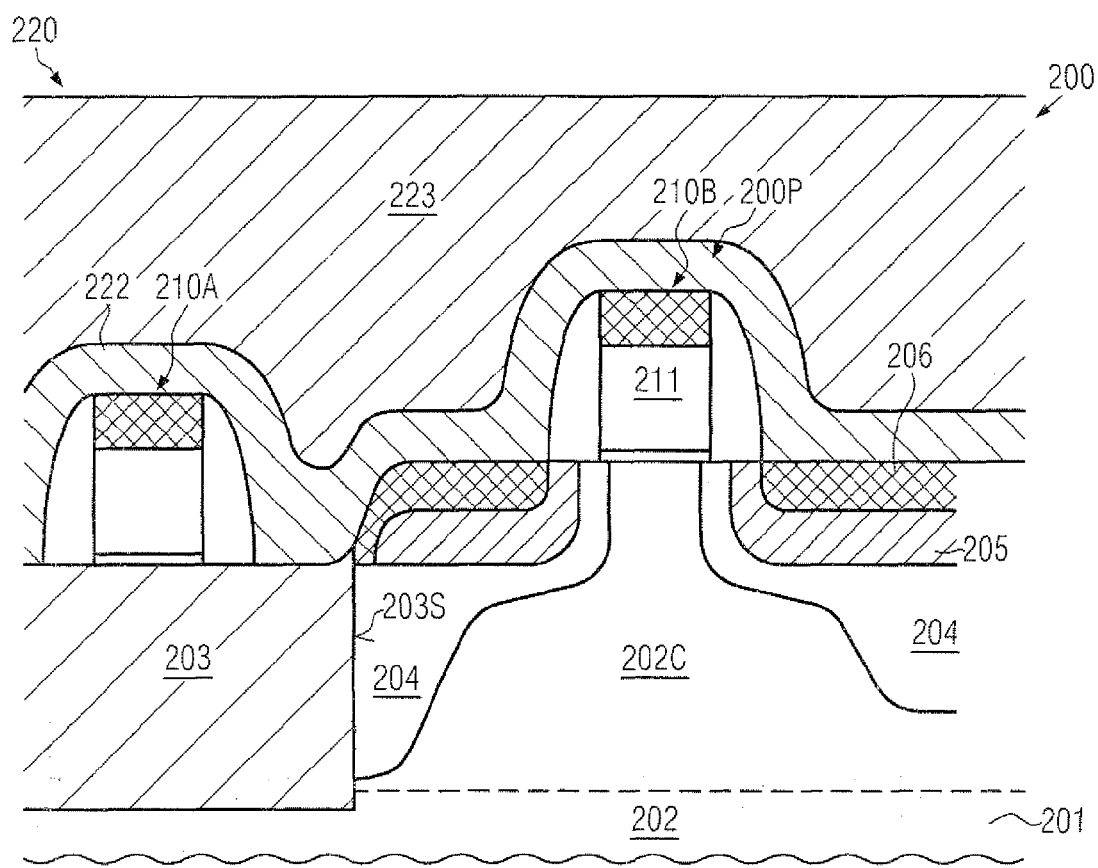

FIG. 2f schematically illustrates the semiconductor device 200 in a further advanced manufacturing stage in which the transistor 200P may be formed in and above the active region 202C. That is, drain and source regions 204 may be provided, wherein one of the regions 204 that is delineated by the isolation structure 203 along the length direction has an increased junction depth due to the presence of the implantation region 241 (FIG. 2e). Consequently, at the critical sidewall 203S, an increased junction depth may be provided so as to reduce the probability of shorting the drain and source regions 204 during the subsequent process for forming contact elements connecting the region 204 with the gate electrode structure 210A formed above the isolation structure 203. Furthermore, the transistor 200P may comprise metal silicide regions 206, as is also previously explained. Additionally, an interlayer dielectric material 220, for instance in the form of material layers 222 and 223, may be provided so as to enclose the transistor 200P and the gate electrode structure 210A. With respect to any process strategies for forming the device 200 as illustrated in FIG. 2f, the same criteria may apply as previously explained with reference to the device 100.

Figure 2G:
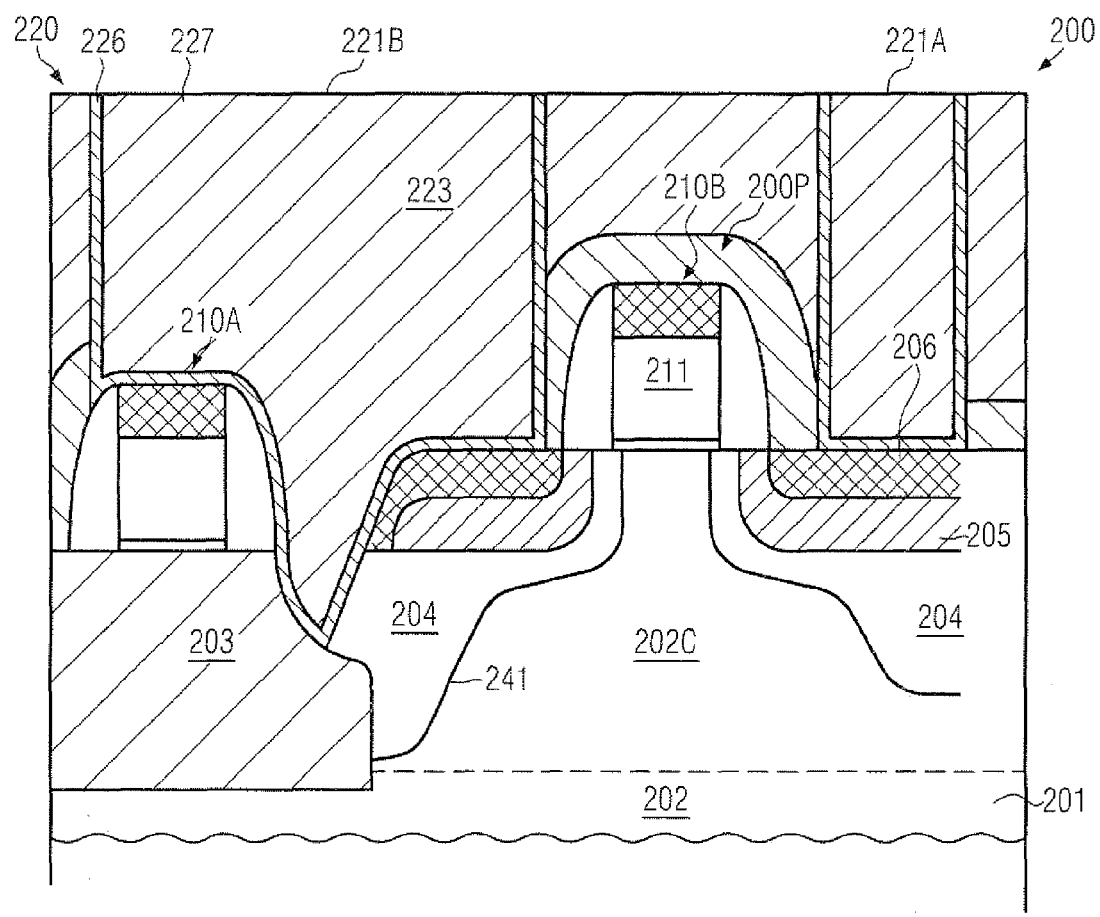

FIG. 2g schematically illustrates the semiconductor device 200 in a further advanced manufacturing stage in which contact elements 221A and 221B are formed in the interlayer dielectric material. As previously explained, the contact element 221A may connect to the active region 202C, i.e., to one of the drain and source regions 204, while the contact element 221B may connect to the gate electrode structure 210A and to the other one of the drain and source regions 204. As illustrated, even if the contact element 221B may extend into the isolation structure 203, the additional depth of the drain or source region 204, obtained by the implantation region 241, may not result in increased leakage paths or short circuiting of the region 204 with respect to the remaining active region 202C. Consequently, for a given manufacturing strategy in forming respective contact openings, as previously explained, and filling the same with any appropriate contact material, such as a barrier material 226 and a contact metal 227, a significantly reduced probability with respect to contact failures of the contact element 221B may be achieved.

Figure 2H:
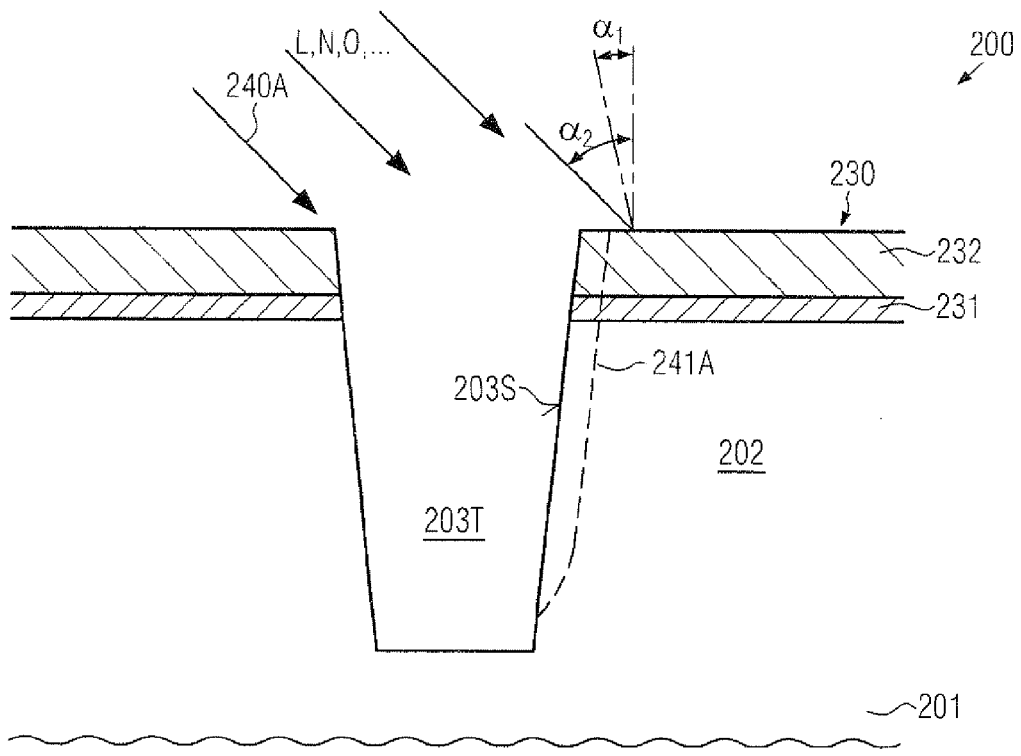
FIGS. 2h-2i schematically illustrate cross-sectional views of the semiconductor device when locally increasing the etch resistivity at a "tip portion" of the active region prior to filling an isolation trench, according to still other illustrative embodiments.

FIG. 2h schematically illustrates a cross-sectional view of the semiconductor device 200 according to further illustrative embodiments in which, in addition or alternatively to a dopant species, other implantation species 241A may be incorporated through the sidewall 203S. For example, a non-doping species, i.e., a species that may not increase conductivity of the semiconductor material 202, may be incorporated in order to modify the material characteristics in the vicinity of the sidewall 203S. For instance, by incorporating carbon, nitrogen, oxygen and the like, the overall etch resistivity during the further processing of the device 200 may be increased compared to the conventional insulating material of the isolation structure to be formed on the basis of the trench 203T. In this manner, the size along the length direction of the trench 203T may be locally increased, depending on the penetration depth of the species 241A. In this manner, the remaining configuration of the isolation trench 203T in other device areas may not be affected, for instance the sidewalls of the active regions may not be substantially affected, as is also previously discussed with reference to FIG. 2d. Furthermore, a corresponding implantation mask 242 may be applied, as discussed with reference to FIG. 2d, if a corresponding modification in the length direction is to be restricted to specific active regions. Moreover, the incorporation of the species 241A may be less critical with respect to selecting an appropriate tilt angle, since incorporation of the species 241A at or in the vicinity of the bottom of the trench 203T may not be critical, thereby allowing an increased range of tilt angles $\alpha_1$-$\alpha_2$. That is, for high aspect ratio trenches, i.e., for trenches having a great depth and a reduced width, the application of a small tilt angle $\alpha$ may be required so as to place the implantation species down to a required depth in order to accommodate etch tolerances during the further processing. Consequently, the distribution of the implantation species 241A, for instance caused during the implantation process 240A and during the subsequent processing in the form of heat treatments and the like, is less critical.

Figure 2I:
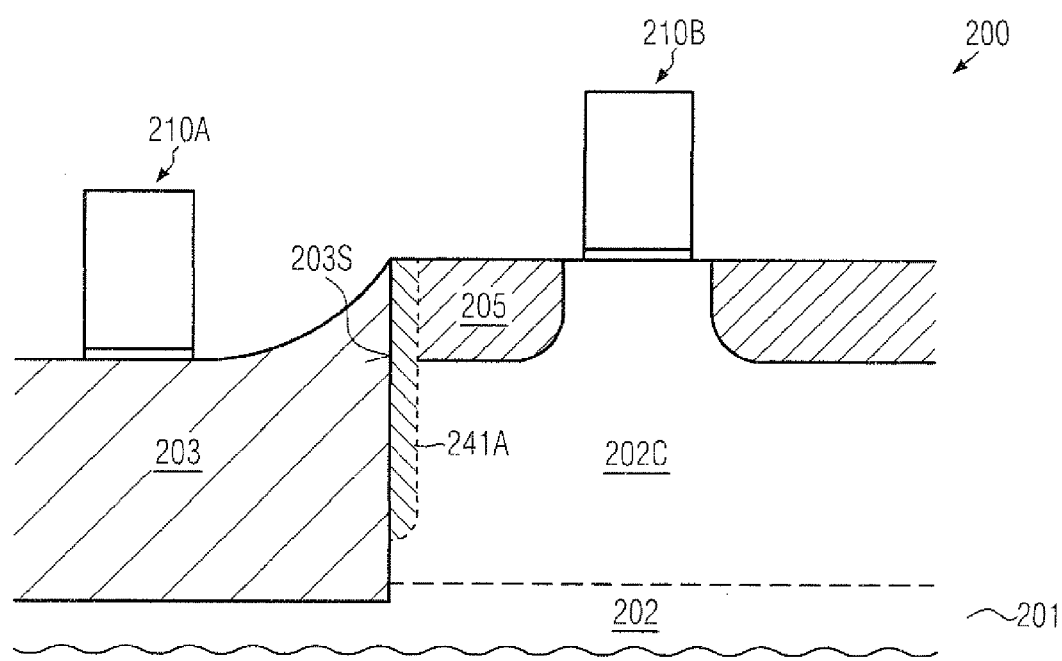

FIG. 2i schematically illustrates the semiconductor device 200 in a further advanced manufacturing stage, i.e., after forming the gate electrode structures 210A, 210B, wherein the implantation species 241A may provide reduced material erosion, at least in the vicinity of the sidewall 203S, for instance in view of cleaning processes, etch processes and the like, which typically result in a pronounced material erosion of the isolation structure 203, as discussed above. For example, the incorporation of a nitrogen species and/or an oxygen species and/or a carbon species may result in a significantly increased etch resistivity or in an increased electrical resistance of the region 241A. For example, when providing for an increased etch resistivity, in addition to the reduced material erosion during the previous processing, also during the critical contact etch process, a resulting material erosion may be significantly less, thereby reducing the probability of creating contact failures. In other cases, providing a zone of increased electrical resistance may significantly reduce leakage currents, when the zone 241A may be contacted by the contact elements due to a significant material erosion of the isolation structure 203. Consequently, also in this case, an increased failure tolerance for the critical contact etch process for providing contact elements connecting the active region 202C with the gate electrode structure 210A may be achieved.

Figure 2J:
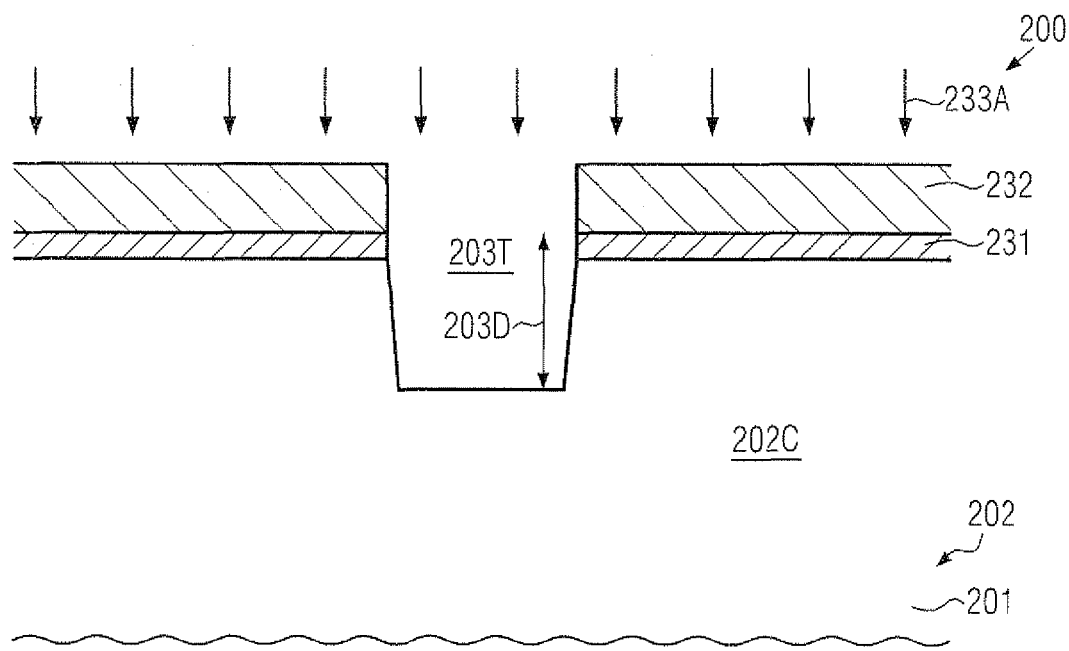
FIGS. 2j-2m schematically illustrate cross-sectional views of the semiconductor device during various manufacturing stages according to still further illustrative embodiments.

FIG. 2j schematically illustrates the semiconductor device 200 according to a further illustrative embodiment in which the device 200 may be exposed to an etch ambient 233A so as to form the isolation trench 203T in the layers 232, 231 and the semiconductor material 202 down to a first depth 203D, which is considered appropriate for incorporating a dopant species.

Figure 2K:
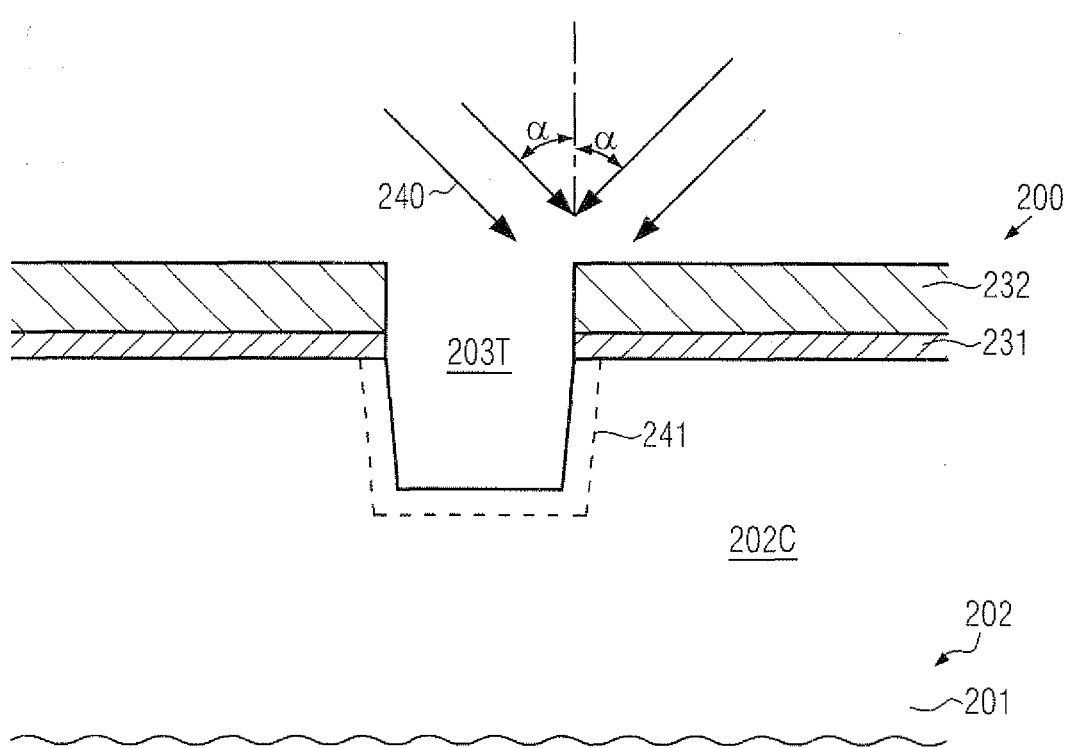

FIG. 2k schematically illustrates the semiconductor device 200 during the implantation process 240 so as to incorporate the dopant species 241, wherein the species 241 may be introduced through the entire depth of the trench 203T, thereby providing an enhanced degree of flexibility in selecting appropriate implantation parameters.

Figure 2L:
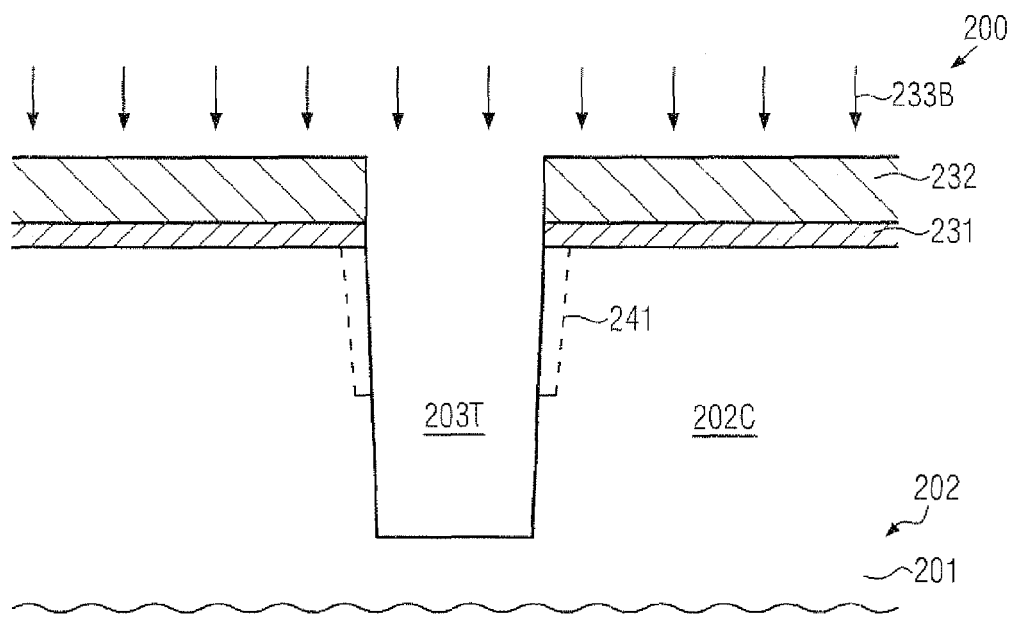

FIG. 2l schematically illustrates the semiconductor device 200 when exposed to a further etch step 233B that may be performed to obtain the final depth of the trench 203T. Consequently, the implantation species 241 may be reliably restricted to an upper portion of the trench 203T, irrespective of the further processing, for instance with respect to dopant diffusion and the like. It should be appreciated that the etch processes 233A, 233B may be performed without any additional mask such that the implantation species 241 may be provided in the portions of any type of active regions.

It should be appreciated that, in other illustrative embodiments, the trench 203T as illustrated in FIG. 2l may be formed on the basis of a single etch process followed by an implantation process, as previously described, wherein the implantation species 241 may be restricted to an upper portion of the trench 203T on the basis of an appropriate selection of process parameters, as previously described. In this case, the implantation may also be performed as an unmasked implantation process, except for the materials 231 and 232, thereby avoiding an additional lithography step.

Figure 2M:
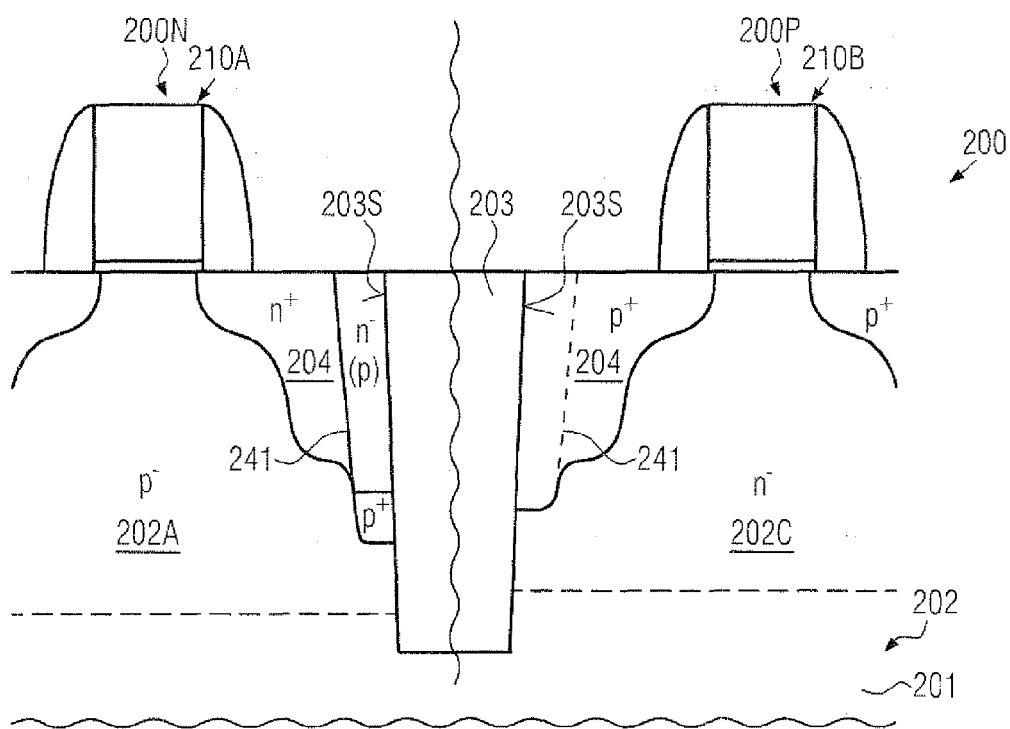

FIG. 2m schematically illustrates the semiconductor device 200 in a further advanced manufacturing stage. In this embodiment, the transistors 200P, i.e., the P-channel pull up transistors, and the N-channel transistor 200N are illustrated and may have the implantation species 241 at corresponding interfaces 203S of the isolation structure 203. It should be appreciated that FIG. 2m represents a section through the active region 202C and a portion of the active region 202A (see FIG. 2a). Consequently, due to the incorporation of the P-type dopant species 241, the depth of the region 204 adjacent to the interface 203S of the transistor 200P may have an increased depth, while on the other hand, in the transistor 200N, the species 241 may result in a reduced overall N-doping of the region 204, while an increased P-type dopant concentration may vertically connect to the region 204, thereby substantially not affecting the overall transistor behavior of the device 200N.

As a consequence, superior process tolerance may be accomplished for the transistor 200P, as described above, without substantially affecting the transistor 200N, while providing superior process efficiency due to the avoidance of an additional lithography step.

As a result, the present disclosure provides semiconductor devices and manufacturing techniques in which contact elements in a memory cell may be provided with an increased failure tolerance by selectively incorporating an implant species at an interface between the active region of a pull up transistor and an isolation structure. Consequently, the contact element providing direct electrical contact between the active region of the pull up transistor and a gate electrode structure formed above the isolation structure may be provided with a significantly reduced probability for contact failures, thereby enabling further device scaling on the basis of available etch techniques.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed is:

1. A method, comprising:
forming an isolation trench in a semiconductor material of a semiconductor device, said isolation trench having a sidewall connecting to an active region of a first transistor of a memory cell of said semiconductor device, said sidewall delineating said active region in a length direction;
introducing an implantation species into a portion of said active region through at least a portion of said sidewall, said implantation species extending along said length direction with a specified distance from said sidewall into said active region;
filling said isolation trench with an insulating material after introducing said implantation species so as to form an isolation structure;
forming said first transistor in and above said active region;
forming a portion of a gate electrode of a second transistor of said memory cell above said isolation structure;
forming a dielectric material so as to enclose said first transistor and said second transistor; and
forming a contact element in said dielectric material, said contact element connecting said active region and said portion of the gate electrode of said second transistor.

2. The method of claim 1, wherein introducing said implantation species comprises performing an implantation process using an ion beam that has a first orientation parallel to said length direction and a second orientation forming a non-zero angle with a surface of said active region.

3. The method of claim 1, wherein said implantation species is introduced as a P-type dopant and wherein said first transistor is a P-channel transistor.

4. The method of claim 1, wherein introducing said implantation species further comprises restricting an extension of said implantation species in a depth direction to be less than an extension of a well region of said first transistor.

5. The method of claim 1, further comprising forming said isolation trench through two or more insulating layers formed on said semiconductor material and using said two or more insulating layers as an implantation mask so as to suppress incorporation of said implantation species in a surface of said active region.

6. The method of claim 1, further comprising forming a mask prior to introducing said implantation species so as to expose said active region and at least a portion of said isolation trench including said sidewall and to cover an active region of another transistor of said memory cell and another isolation trench laterally delineating said another active region.

7. The method of claim 6, wherein said another transistor is an N-channel transistor.

8. The method of claim 1, further comprising forming a strain-inducing semiconductor alloy in said active region after introducing said implantation species.

9. The method of claim 1, wherein introducing said implantation species comprises introducing an etch rate reducing species that imparts increased etch resistivity to a portion of said active region positioned adjacent to said sidewall.

10. The method of claim 9, wherein said etch rate reducing species comprises at least one of oxygen, nitrogen and carbon.

11. The method of claim 1, wherein forming said isolation trench comprises forming said isolation trench to a first depth prior to introducing said implantation species and extending a depth of said isolation trench to a second depth after introducing said implantation species, wherein said second depth is greater than a depth of said implantation species in said active region.

12. A method, comprising:
forming an isolation trench in a semiconductor material and in an insulating material formed on said semiconductor material, said isolation trench laterally delineating a first active region of one or more P-channel transistors and a second active region of one or more N-channel transistors of a memory cell of a semiconductor device, said isolation trench having a sidewall connecting to a portion of said first active region;

forming a mask so as to expose said first active region and at least said sidewall and to cover said second active region and a portion of said isolation trench;

implanting a species into said first active region through said sidewall by performing an implantation process on the basis of a non-zero tilt angle and using said mask and said insulating material as an implantation mask;

after implanting said species, filling said isolation trench with an insulating material so as to form an isolation structure;

forming said one or more P-channel transistors in and above said first active region and said one or more N-channel transistors in and above said second active region, wherein a portion of a gate electrode structure of at least one of said one or more N-channel transistors is formed above said isolation structure; and forming a contact element so as to connect said first active region with said gate electrode of said at least one of said one or more N-channel transistors.

13. The method of claim 12, wherein said species is a P-type dopant species.

14. The method of claim 12, wherein said species is selected so as to locally reduce conductivity of said first active region.

15. The method of claim 12, wherein said species is selected so as to locally modify an etch resistivity in at least one of said active region and said isolation structure.

16. The method of claim 15, further comprising forming a well region in said semiconductor material so as to vertically delineate said first active region and wherein a depth of said well region is less than a depth of an implantation region defined by said species.

17. The method of claim 12, wherein said implantation process is performed substantially parallel with respect to a length direction of said first active region.

18. The method of claim 12, further comprising forming a well region in said semiconductor material so as to vertically delineate said first active region and wherein a depth of said well region is greater than a depth of an implantation region defined by said species.

19. The method of claim 12, further comprising locally forming a strain-inducing semiconductor alloy in said first active region.

20. The method of claim 12, wherein forming said isolation trench comprises forming said isolation trench to a first depth prior to implanting said species and extending a depth of said isolation trench to a second depth after implanting said species, wherein said second depth is greater than a depth of said implanted species in at least said first active region.

* * * * *